United States Patent
Bird et al.

(10) Patent No.: US 7,330,055 B2
(45) Date of Patent: Feb. 12, 2008

(54) CIRCUIT WITH HIGH POWER DENSITY APPLICABILITY

(75) Inventors: Ross W. Bird, Canton, PA (US); Brian Shea, Albuquerque, NM (US); Michael Goehrig, Lock Haven, PA (US); Chad Savitz, Williamsport, PA (US)

(73) Assignee: QorTek, Inc., Williamsport, PA (US)

( * ) Notice: Subject to any disclaimer, the term of this patent is extended or adjusted under 35 U.S.C. 154(b) by 166 days.

(21) Appl. No.: 11/258,791

(22) Filed: Oct. 26, 2005
(Under 37 CFR 1.47)

(65) Prior Publication Data
US 2006/0087349 A1 Apr. 27, 2006

Related U.S. Application Data

(60) Provisional application No. 60/622,323, filed on Oct. 26, 2004.

(51) Int. Cl.
*H03B 1/00* (2006.01)
(52) U.S. Cl. ..................................... 327/108
(58) Field of Classification Search ............... 327/108, 327/109, 110, 111, 112, 170; 326/21, 27, 326/82, 83
See application file for complete search history.

(56) References Cited

U.S. PATENT DOCUMENTS

| | | | | |
|---|---|---|---|---|
| 6,466,063 B2* | 10/2002 | Chen | ........................... | 327/112 |
| 6,624,660 B2* | 9/2003 | Li et al. | ........................ | 326/83 |
| 7,116,073 B1* | 10/2006 | Sorkin | ........................ | 318/530 |

* cited by examiner

*Primary Examiner*—Adolf Berhane
(74) *Attorney, Agent, or Firm*—Michael Crilly, Esq.

(57) ABSTRACT

A power control circuit is presented. The circuit includes a pair of parallel optocoupler/logic stages and a pair of parallel voltage-to-current driver stages electrically coupled to a halfbridge stage in the order described. An input signal is communicated to the optocoupler/logic stage and processed therein to produce two distinctly separate but complimentary waveforms. Complimentary waveforms are communicated to the voltage-to-current driver stage to drive a paired arrangement of JFET switches. Thereafter, the JFET switches communicate with the halfbridge stage to control function of BJT switches. BJT switches are sequenced to produce a high power output. The present invention has immediate applicability to power conditioning, control, and distribution systems, as well as other applications which include or rely on silicon power transistors.

9 Claims, 7 Drawing Sheets

CIRCUIT WITH HIGH POWER DENSITY APPLICABILITY

CROSS REFERENCE TO RELATED APPLICATIONS

This application is based upon and claims priority under 35 U.S.C. § 119(e) from U.S. Provisional Application No. 60/622,323 filed Oct. 26, 2004, entitled High Impedance Junction Bipolar Transistor, the contents of which are hereby incorporated in its entirety by reference thereto.

FEDERALLY SPONSORED RESEARCH AND DEVELOPMENT

None.

BACKGROUND OF THE INVENTION

1. Field of the Invention

The present invention generally relates to a power control circuit. Specifically, the invention is a circuit, comprising silicon carbide junction field effect transistors and bipolar junction transistors, to control current flow via complimentary waveforms to gates within the circuit.

2. Description of the Related Art

Advanced power systems are required to facilitate extended missions, one non-limiting example being deep space exploration. Performance of such systems requires efficient transfer of power to multiple subsystems and devices. Power conditioning and control are critical to the viability of these systems.

Power transistors are the basis of power conditioning and control systems. The performance capabilities of power transistors greatly influence a variety of critical parameters including efficiency, thermal handling, volume, and mass.

Control architectures for high power systems must operate at elevated temperatures and high switching speeds. Insulated gate bipolar transistors (IGBTs) are compatible with high current and high voltage switching, thereby suggesting their applicability to power electronics at very high power levels. However, IGBTs have slow switching speeds and low operational temperatures. Slow switching speeds cause excessively noisy output, inefficient operation, and component stress. Improved efficiency and reduced stress are possible with output filtering; however, output filters are excessively bulky and heavy. Low operational temperatures quickly degrade performance and in the extreme cause their complete failure, thereby requiring thermal management solutions.

It is generally understood that high switching speeds are required to achieve high power densities in power electronics. Silicon carbide (SiC) switching devices have an extremely short reverse recovery time and operate effectively at elevated temperatures. However, individual SiC devices are not commercially available in IGBT and metal-oxide semiconductor field-effect transistor (MOSFET) devices. Bipolar junction transistors (BJTs), a current controlled current source, and diodes, a directional device, are mature technologies; however, bipolar devices are not easily implemented within switching electronics because of their current controlled functionality.

Therefore, what is required is a transistor-based circuit composed of silicon carbide power transistors and power components, for use within very-high power applications, which avoids the problems and deficiencies of the related arts.

SUMMARY OF INVENTION

An object of the present invention is to provide a circuit comprising silicon carbide based switch devices and power components so as to achieve the power handling of IGBTs and the switching bandwidth of MOSFETs.

The present invention includes circuit architecture and switches with high-temperature and high-speed capabilities. Circuit architecture is composed of a power electronics system of minimal size and volume. Switches include high-temperature silicon carbide based bipolar junction transistors (BJTs) and junction field effect transistors (JFETs). The invention avoids the power limitations associated with commercial silicon carbide transistors by merging and exploiting two independent functional capabilities of these components.

The present invention offers several advantages. The invention provides better power handling and switching speeds than IGBTs and MOSFETs. Thermal handling is an integral feature rather than an afterthought as with IGBTs and MOSFETs. The invention facilitates greater power densities within critical power supplies, inverters, converters and generators, thereby enabling improved controller reliability and operation, higher power to instruments, and higher data rates for acquisition and transmission. The invention increases the operational lifetime of power sources and reduces operational mass via improved efficiency and lower thermal expenditure. The invention enables management of high voltage and high power for continuous drive waveforms.

REFERENCE NUMERALS

1 Power control circuit
2 Optocoupler/logic stage
3 Voltage-to-current driver stage
4 Halfbridge stage
5 Input signal
6 Optocoupler
8 First output signal
9 Second output signal
10 Output
11 On delay
12 Rise time delay sub-circuit
13 Rise time delay sub-circuit
14 Trimmer sub-circuit
15 Rise time delay sub-circuit
16 Rise time delay sub-circuit
K1, K2, K3 Comparator
R1, R2, R4, R5 Resistor
VR3 Variable resistor
D1, D2, D3, D4, D5, D6 Diode
VC1, VC2 Variable capacitor
G1, G2, G3, G4 Ground
S1, S2, S3, S4 Switch
Q1, Q2 Output transistor
Power supply $V_A$, $V_B$, $V_C$, $V_{BUS}$

BRIEF DESCRIPTION OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

Figure 1:
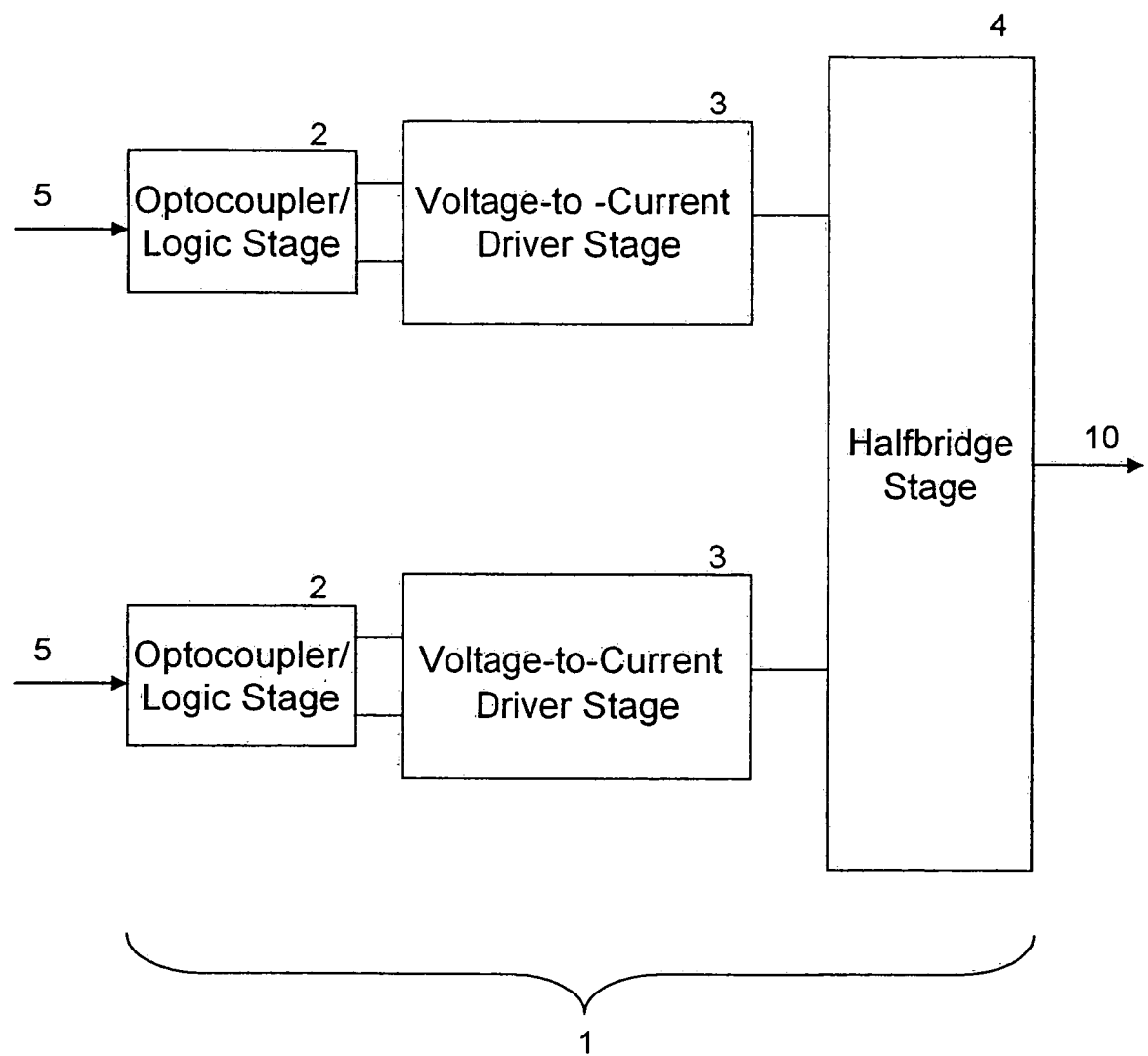
FIG. 1 is a block diagram representation of the present invention.

Referring now to FIG. 1, the present invention, generally referred to as a power control circuit 1, comprises two serial arrangements, aligned in a parallel fashion, each including an optocoupler/logic stage 2 and a voltage-to-current driver stage 3 electrically coupled to a halfbridge stage 4 in the order described. An input signal 5 is communicated to the optocoupler/logic stage 2 and processed therein to produce two distinctly separate voltage waveforms which are temporally shifted and complimentary. Complimentary waveforms are communicated to the voltage-to-current driver stage 3 to drive JFET devices arranged in a serial fashion. Thereafter, the JFET devices communicate with the halfbridge stage 4 to control function of BJT devices therein. BJT devices are sequenced to produce an output 10 in the form of a high-power voltage waveform.

Figure 2:
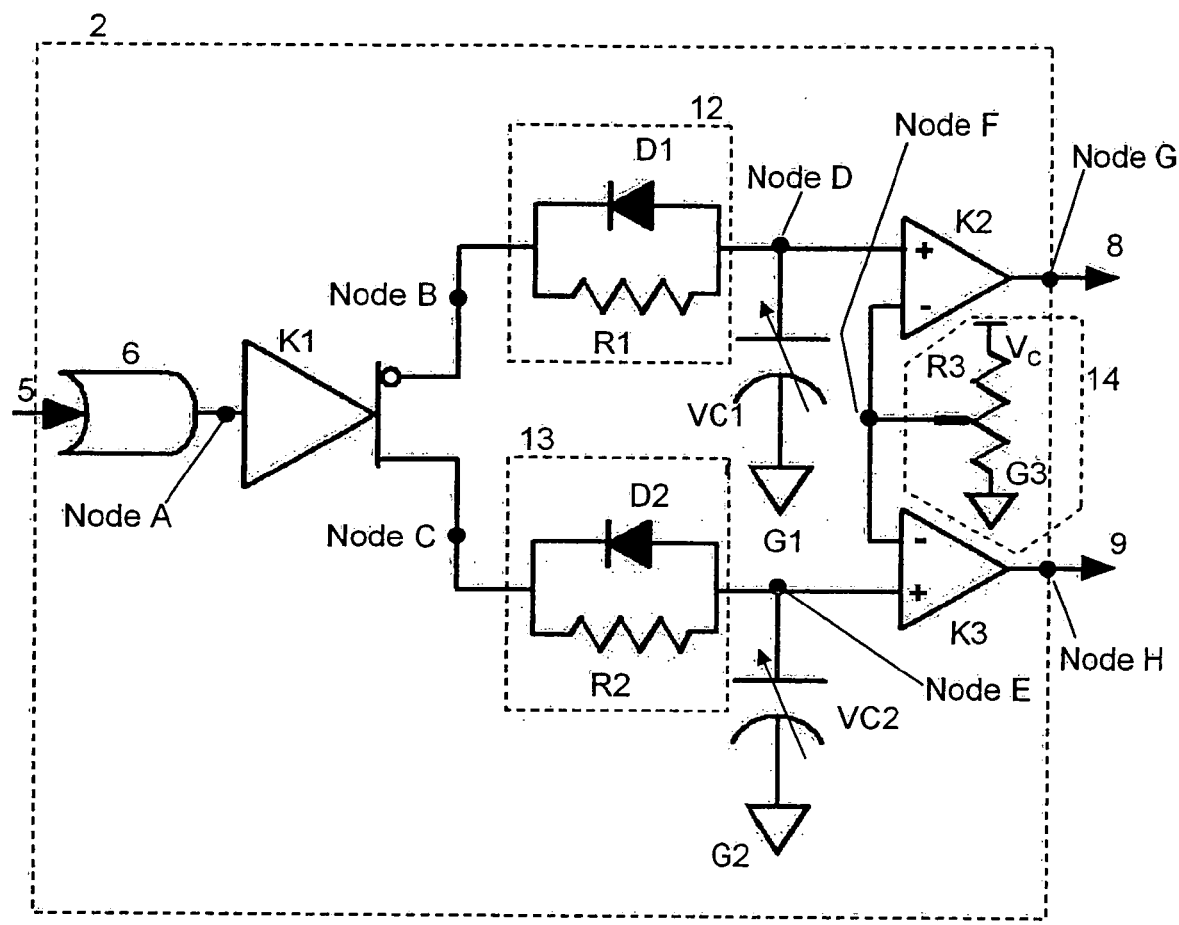
FIG. 2 is a circuit diagram for the optocoupler/logic stage of the power circuit.
Figure 4:
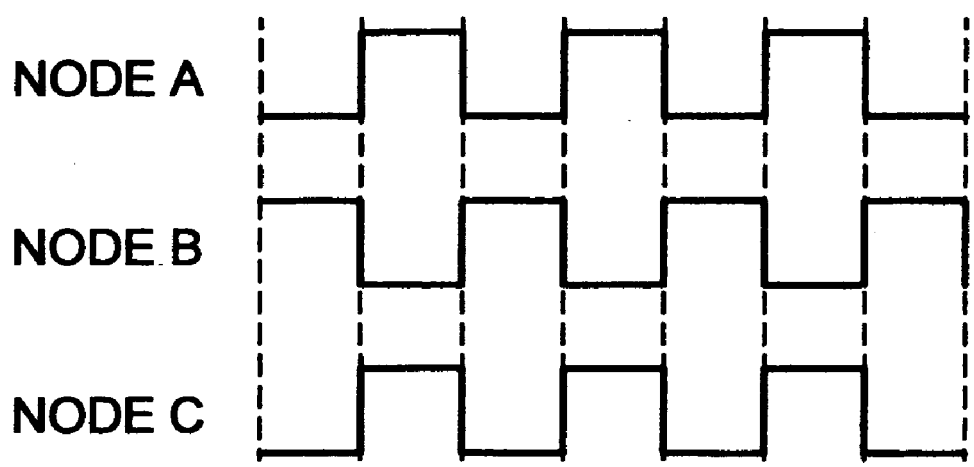
FIG. 4 is a voltage plot showing exemplary waveforms at Nodes A, B, and C shown in FIG. 2.
Figure 5:
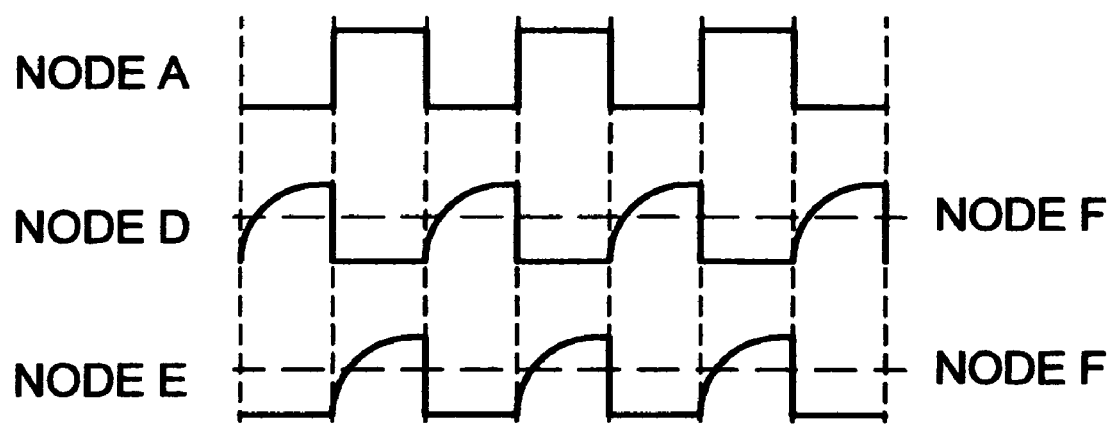
FIG. 5 is a voltage plot showing exemplary waveforms at Nodes A, D, E, and F shown in FIG. 2.
Figure 6:
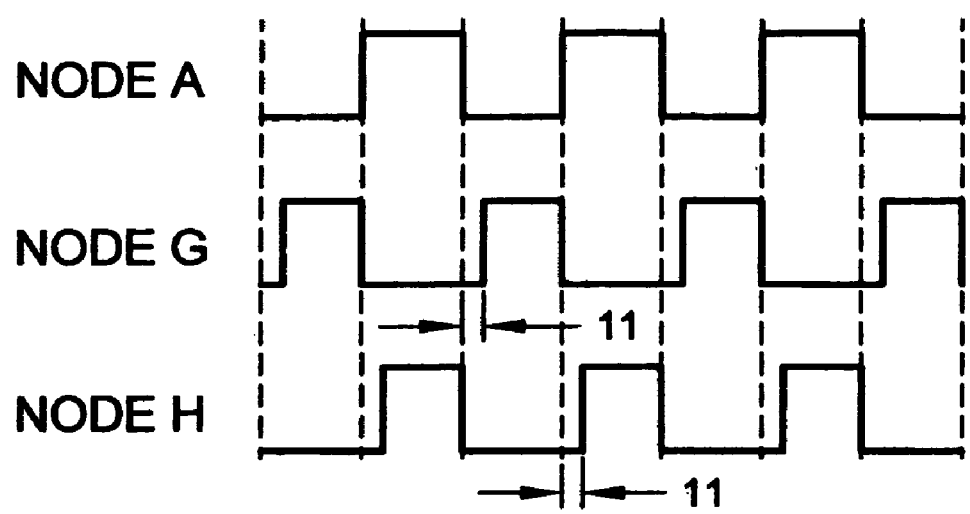
FIG. 6 is a voltage plot showing exemplary waveforms at Nodes A, G, and H shown in FIG. 2.

Referring now to FIG. 2, the optocoupler/logic stage 2 is shown and described. The optocoupler/logic stage 2 includes any commercially available optocoupler 6 capable of electrically isolating low level drive signals within the input signal 5 from the high-power drive signals on the output side at NODE A. FIGS. 4-6 show an exemplary voltage signal from the optocoupler 6 at NODE A.

The optocoupler 6 is electrically connected to a comparator K1. The comparator K1 is any commercially available device capable of providing two complimentary square waves from a single square wave input. A parallel arrangement of like devices is disposed about the comparator K1.

The first side of the parallel arrangement is composed of a diode D1 and a resistor R1 in parallel to form a rise time delay sub-circuit 12. One end of the rise time delay sub-circuit 12 is electrically coupled to the comparator K1 and the opposite end is electrically coupled to the positive terminal of another comparator K2. A variable capacitor VC1 is electrically coupled at one end between the rise time delay sub-circuit 12 and comparator K2 and at the other end to ground G1. The described circuit produces a waveform, referred to here as the first output signal 8, which is communicated to switches S1 and S3 within the voltage-to-current driver stages 3.

The second side of the parallel arrangement is composed of a diode D2 and a resistor R2 in parallel to form a second rise time delay sub-circuit 13. One end of the rise time delay sub-circuit 13 is electrically coupled to the comparator K1 and the opposite end is electrically coupled to the positive terminal of another comparator K3. A variable capacitor VC2 is electrically coupled at one end between the rise time delay sub-circuit 13 and comparator K3 and at the other end to ground G2. Comparators K2 and K3 are electrically coupled at their respective negative terminals. The described circuit produces a waveform, referred to here as the second output signal 9, which is communicated to switches S2 and S4 within the voltage-to-current driver stages 3.

A trimmer sub-circuit 14 is connected to the electrical coupling between and provides variable input for the timing comparators K2 and K3. The trimmer sub-circuit 14 includes a variable resistor VR3 with wiper tied to the inverting input of the timing comparators K2 and K3. The variable resistor VR3 is electrically coupled at one end to a power supply $V_C$ positive of the logic circuit and the other end to ground G3.

Comparator K1 communicates time shifted voltage waveforms to each of the rise time delay sub-circuits 12, 13 comprising the optocoupler/logic stage 2. For example, FIG. 4 shows exemplary voltage waveforms at NODES A, B, and C about the comparator K1. A square wave voltage signal, as shown at NODE A, is communicated into the comparator K1. Two complimentary waveforms, as represented at NODES B and C, are produced by the comparator K1 at the output side and directed to the respective rise time delay sub-circuits 12, 13.

Referring now to FIGS. 2 and 5, the rise time delay sub-circuits 12, 13 and variable capacitors VC1, VC2 alter the waveforms at NODES B and C so as to produce the waveforms at NODES D and E, respectively. Diodes D1 and D2 cause the variable capacitors VC1 and VC2, respectively, to be charged through resistors R1 and R2, respectively, on the rising edge of the waveform. During the rising edge, the voltage at NODES B and C is greater than the voltage at NODES D and E, respectively, thus reverse biasing diodes D1 and D2. During the trailing edge, the voltage at NODES B and C is less than the voltage at NODES D and E, respectively, thus forward biasing the diodes D1 and D2.

Referring now to FIGS. 2 and 6, the trimmer sub-circuit 14 modifies the waveforms shown at NODES D and E so as to produce the waveforms at NODES G and H, respectively. As shown in FIG. 5, NODES D and F and NODES E and F are superimposed onto each other with NODE F being the output of the trimmer sub-circuit 14. NODES D and E are located at the non-inverting input of comparators K2 and K3, respectively, and NODE F is located at the inverting input as the compare voltage. When NODE D or E exceeds the voltage of NODE F, the output of comparator K2 at NODE G or comparator K3 at NODE H is the power supply voltage or a high level. As such, the circuit functions as an analog delay to the rising edge of the waveform.

Referring again to FIG. 6, the on delay 11 functions as a dead time control to eliminate cross conduction between switches S1-S4. For example, when switches S1-S4 are driven by complementary waveforms, switches S1 and S2 and switches S3 and S4 could cross conduct during transitions. The ON and OFF states of switches S1-S2 and S3-S4 are not instantaneous, thus shorting the positive and negative bus voltage through the respective devices with only the ON resistance of the device limiting current. The resultant current transients quickly exceed the current rating of the switch S1-S4 causing damage. The trimmer sub-circuit 14 delays each turn ON state, thus allowing one switch S1-S4 within a paired arrangement to turn OFF before the corresponding switch S1-S4 turns ON.

Figure 3:
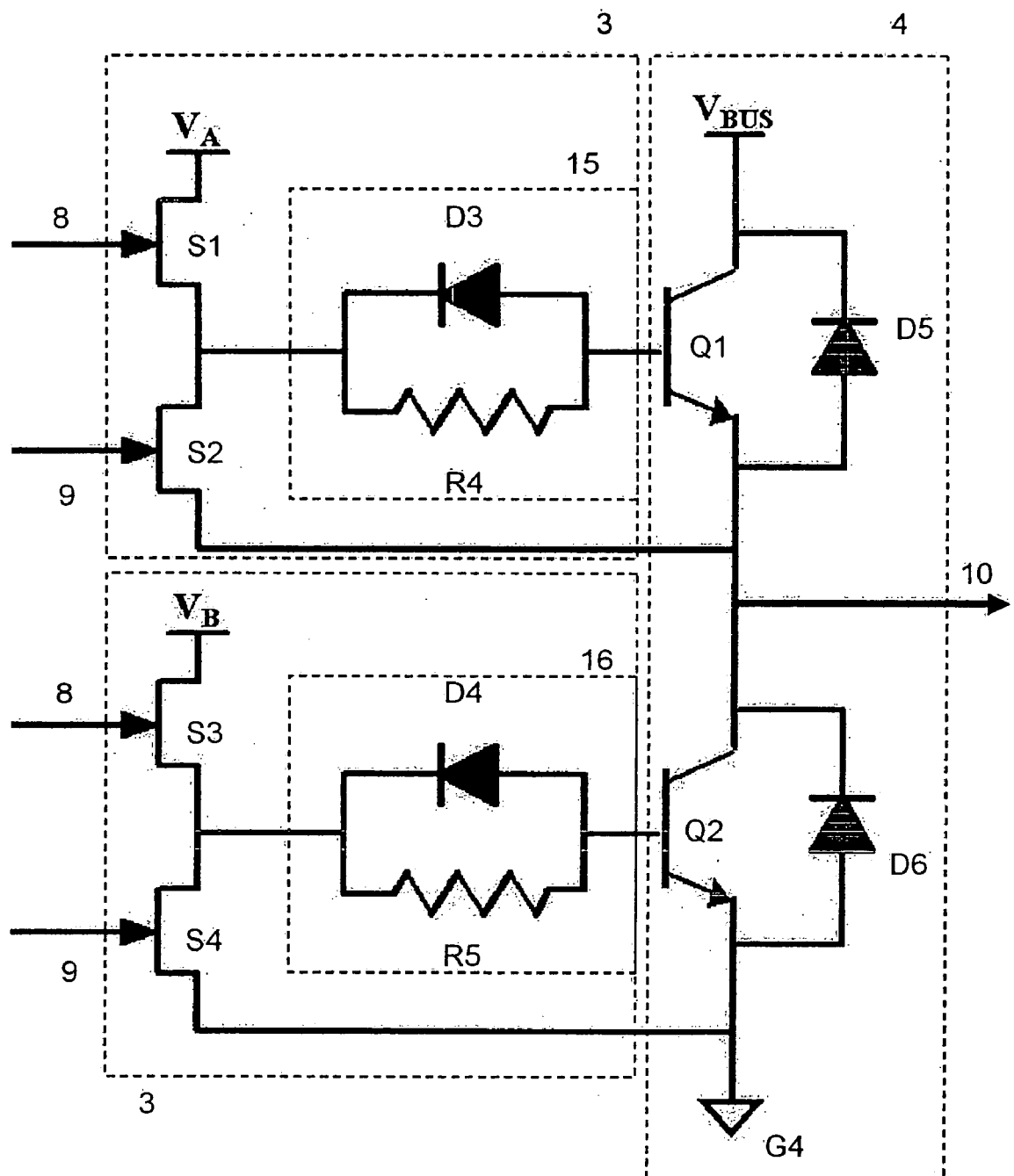
FIG. 3 is a circuit diagram for voltage-to-current driver and halfbridge stages of the power circuit.

Referring now to FIG. 3, two voltage-to-current driver stages 3 are shown comprising a paired arrangement of switches S1-S2 and S3-S4 electrically coupled to control operation of output transistors Q1 and Q2, respectively, in the halfbridge stage 4. A first voltage-to-current driver stage 3 comprises switches S1 and S2 electrically coupled in series. One lead from switch S1 is electrically coupled to a power supply $V_A$. A rise time delay sub-circuit 15, including a resistor R4 and a diode D3 electrically coupled in a parallel fashion, is also electrically coupled at one end between switches S1 and S2. The opposite end of the rise time delay sub-circuit 15 is electrically coupled to the output transistor Q1. A second voltage-to-current driver stage 3 comprises switches S3 and S4 electrically coupled in series. One lead from switch S3 is electrically coupled to a power supply $V_B$. A rise time delay sub-circuit 16, including a resistor R4 and a diode D3 electrically coupled in a parallel fashion, is also electrically coupled at one end between switches S3 and S4. The opposite end of the rise time delay sub-circuit 16 is electrically coupled to another output transistor Q2.

Referring again to FIG. 3, the halfbridge stage 4 is shown comprising a pair of output transistors Q1 and Q2 electrically coupled in series. A lead from the output transistor Q1 is electrically coupled to a power supply $V_{BUS}$. Likewise, a lead from the output transistor Q2 is electrically coupled to ground G4. A diode D5 and D6 is electrically coupled about each of the output transistors Q1 and Q2, respectively. Thereafter, switch S2 is electrically coupled at one end between output transistors Q1 and Q2 and switch S4 is electrically coupled at one end between the output transistor Q2 and ground G4. An electrical lead is provided between the connection of switch S2 within the halfbridge stage 4 and the output transistor Q2 so as to communicate a pulse width modulated output 10 from the halfbridge stage 4 to a device or other circuit.

Switches S1-S4 are any commercially available silicon carbide JFET device, also known as a voltage controlled current source (VCCS). It is preferred for the switches S1-S4 to have a breakdown voltage, drain-to-gate ($V_{DG}$), of 25 Volts DC. The current rating should exceed the desired instantaneous output current of the halfbridge divided by the current gain ($\beta$) of the output transistors Q1 and Q2. Switches S1-S2 and S3-S4 act in a totem pole switch configuration turning current ON and OFF to the output transistors Q1 and Q2. The output transistors Q1 and Q2 are any commercially available silicon carbide BJT device.

Figure 7:
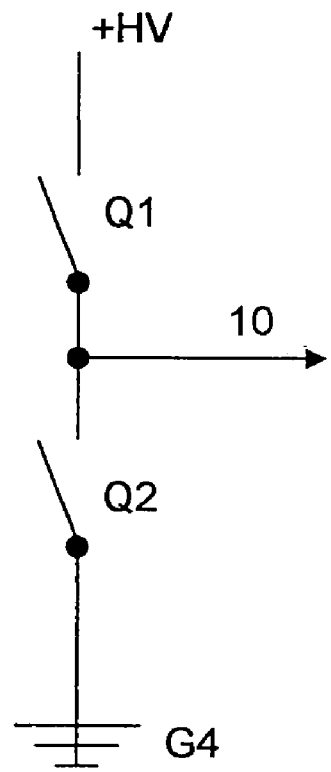
FIG. 7 is a function representation of the halfbridge stage.

The operation of output transistors Q1 and Q2 are determined by the sequenced ON and OFF of the paired arrangement and function of switches S1-S2 and S3-S4. FIG. 7 is a simplified functional representation of the halfbridge stage 4 where the optocoupler/logic stage 2 and voltage-to-current driver stage 3 are a means for controlling the ON and OFF states of the output transistors Q1 and Q2. The halfbridge stage 4 effectively enables the sequenced function of the output transistors Q1 and Q2 based upon the input signal 5, the latter shown in FIG. 1. The result is a high voltage waveform at the output 10.

Switches S1-S4 and output transistors Q1, Q2 include commercially available devices. Switches S1-S4 may be any solid-state device in which current is controlled between source and drain regions by voltage applied to a conducting or junction gate terminal. In preferred embodiments, switches S1-S4 are high gain silicon carbide JFETs. It is likewise preferred that each have a positively sloped gain-to-temperature profile. Output transistors Q1 and Q2 may be any solid-state device in which current variations between a base and one terminal called the emitter cause a variation of the current flow between the emitter and a third terminal referred to as the collector, thus amplifying the signal at that terminal. In preferred embodiments, output transistors Q1, Q2 are silicon carbide BJTs, one non-limiting example being a high-voltage NPN BJT on 4H-SiC. While BJTs have a current gain inversely related to temperature, it is preferred to have a current gain profile that is directly related to temperature.

Although the power control circuit 1 described above is capable of operating at elevated temperatures, it is preferred that it be mechanically fastened and/or otherwise bonded to, via techniques understood in the art, or contacting a structure to dissipate heat and minimize thermal stresses at very-higher power densities. For example, switches S1-S4 and output transistors Q1, Q2 may directly contact and be attached to a thermally conducive substrate having the general form of a plate or heat sink. A thermally conductive silicon or epoxy may be applied between switches S1-S4 and output transistors Q1, Q2 and thermally conductive plate or heat sink so as to further enhance conductivity.

A variety of thermally conductive materials may be adequate for most applications. However, thermally oriented composites composed of a machinable metal alloy reinforced with inclusions, non-limiting examples including conductive fibers, whiskers, and/or particulates, may be advantageous at high power densities. Exemplary composites include thermal management compositions sold by MMCC, LLC located in Waltham, Mass.

In typical power switching applications, it is desired to have the output transistors Q1, Q2 normally OFF. In the present invention, switches S1-S4 within voltage-to-current driver stage 3 are normally ON, thereby functioning in the normally OFF state regardless of the power state. The coupling of enhanced mode silicon carbide JFETs and one or more gate drive power supplies provides a JFET device that is effectively normally OFF. Furthermore, gate drive power may be monitored and actively adjusted when a loss of gate drive power is detected by a feedback signal to a control system. Control system and power from a separate supply may be used to enable shutdown of the DC bus supply when a catastrophic failure is detected.

The above described power circuit 1 is functionally similar to a high power IGBT module, but with improved switching characteristics, thermal qualities, and power density. For example, it is possible for the present invention to operate at 200 to 400 amps at a temperature of 350° C. and a voltage range between 600 and 1500 volts.

The present invention may be fabricated from a variety of commercially available devices. TABLE 1 summarizes exemplary components for one possible embodiment.

TABLE 1

| Component | Manufacturer | Model No. | Description |
|---|---|---|---|
| Optocoupler (6) | Agilent | HCPL-0211 | Optocoupler |
| Comparator (K1, K2, K3) | LINEAR | LT1711 | High-speed comparator |
| Resistor (R1, R2) | Yageo America | RC0805JR-0722KL | 22 k$\Omega$, 1/8 W |
| Variable resistor (VR3) | Bournes | TC89P-1-104 | 100 k$\Omega$ Pot |
| Resistor (R4, R5) | — | — | 30$\Omega$ High temp resistor |
| Diode (D1, D2) | Diodes Inc | LL4148-13 | 75 V 500 mW Diode |
| Diode (D3, D4, D5, D6) | CREE | CSD10060 | 600 V 10 A SiC diode |
| Capacitor (C1, C2) | Panasonic/ECG | ECJ-2VC1H470J | 47 pF, 16 Vdc |
| Switch (S1, S2, S3, S4) | CREE | JFET DIE | >25 V 2 A JFET |
| Output transistor (Q1, Q2) | CREE | BJT DIE | 1200 V 20 A BJT |
| Power supply ($V_A$, $V_B$) | — | DC supply | 12 V 10 A supply |
| Power supply ($V_C$) | — | DC supply | 5 V nominal |
| Power supply ($V_{BUS}$) | | High voltage supply | 600 V 36 A supply |

The description above indicates that a great degree of flexibility is offered in terms of the present invention.

Although the present invention has been described in considerable detail with reference to certain preferred versions thereof, other versions are possible. Therefore, the spirit and scope of the appended claims should not be limited to the description of the preferred versions contained herein.

The invention claimed is:

1. A power control circuit comprising:
   (a) a first optocoupler/logic stage, said first optocoupler/logic stage receiving a first input signal and outputting a first pair of complimentary voltage waveforms;
   (b) a second optocoupler/logic stage, said second optocoupler/logic stage receiving a second input signal and outputting a second pair of complimentary voltage waveforms;
   (c) a first voltage-to-current driver stage, said first optocoupler/logic stage electrically coupled to said first voltage-to-current driver stage, said first pair of complimentary voltage waveforms driving to a first pair of JFET switches within said first voltage-to-current driver stage;
   (d) a second voltage-to-current driver stage, said second optocoupler/logic stage electrically coupled to said second voltage-to-current driver stage, said second pair of complimentary voltage waveforms driving to a second pair of JFET switches within said second voltage-to-current driver stage; and
   (e) a halfbridge stage, said first voltage-to-current driver stage and said second voltage-to-current driver stage electrically coupled to said halfbridge stage, said first pair of JFET switches controlling a first BJT switch within said halfbridge stage, said second pair of JFET switches controlling a second BJT switch within said halfbridge stage, said first BJT switch and said second BJT switch functionally sequenced to produce a high-power output signal.

2. The power control circuit of claim 1, wherein said first pair of JFET switches and said second pair of JFET switches are composed of a temperature resistant silicon carbide.

3. The power control circuit of claim 1, wherein said first BJT switch and said second BJT switch are composed of a temperature resistant silicon carbide.

4. The power control circuit of claim 1, wherein said first optocoupler/logic stage and said second optocoupler/logic stage each comprising:
   (i) an optocoupler;
   (ii) a first comparator electrically coupled to said optocoupler;
   (iii) a pair of rise time delay circuits each having a diode and a resistor electrically coupled and parallel, each said rise time delay circuit electrically coupled at one end to said first comparator;
   (iv) a second comparator electrically coupled to one said rise time delay circuit, said second comparator electrically coupled to one said JFET switch within said first voltage-to-current driver stage;
   (v) a third comparator electrically coupled to another said rise time delay circuit, said third comparator electrically coupled to another said JFET switch within said first voltage-to-current driver stage, said second comparator electrically coupled to said third comparator;
   (vi) a trimmer circuit electrically coupled between said second comparator and said third comparator, said trimmer circuit eliminating cross conduction between said JFET switches; and
   (vii) a pair of variable capacitors, one said variable capacitor electrically coupled at one end between one said rise time delay circuit and said second comparator and grounded at another end, another said variable capacitor electrically coupled at one end between another said rise time delay circuit and said third comparator and grounded at another end.

5. The power control circuit of claim 4, wherein said trimmer circuit comprising:
   (viii) a variable resistor grounded at one end and attached to a power source at another end.

6. The power control circuit of claim 1, wherein said first voltage-to-current driver stage and said second voltage-to-current driver stage each comprising:
   (i) a pair of JFET switches electrically coupled in series, said pair of JFET switches electrically coupled at one end to a power source and at another to said halfbridge stage; and
   (ii) a rise time delay circuit having a diode and a resistor electrically coupled and parallel, said rise time delay circuit electrically coupled at one end between said pair of JFET switches and at another end to one said BJT switch.

7. The power control circuit of claim 1, wherein said halfbridge stage comprising:
   (i) a first BJT switch electrically coupled and parallel to a first diode, said first BJT switch and said first diode electrically coupled at one end to a power supply; and
   (ii) a second BJT switch electrically coupled and parallel to a second diode, said second BJT switch and said second diode electrically coupled at one end to ground and at another end to said first BJT switch and said first diode.

8. The power control circuit of claim 7, further comprising:
   (iii) an electrical lead electrically coupled at one end between said first BJT switch and said second BJT switch.

9. The power control circuit as in one of claims 1-8, wherein said power control circuit is disposed along a thermally conductive substrate.

* * * * *